United States Patent [19]

Lamarche

[11] Patent Number: 5,229,653
[45] Date of Patent: Jul. 20, 1993

[54] ELECTRONIC SWITCH APPARATUS

[75] Inventor: Jean-Luc Lamarche, Langenargen, Fed. Rep. of Germany

[73] Assignee: ifm electronic gmbh, Essen, Fed. Rep. of Germany

[21] Appl. No.: 733,750

[22] Filed: Jul. 24, 1991

[30] Foreign Application Priority Data

Jul. 24, 1990 [DE] Fed. Rep. of Germany ....... 4023502
May 6, 1991 [DE] Fed. Rep. of Germany ....... 4114763

[51] Int. Cl.[5] .......................................... H01H 35/00
[52] U.S. Cl. .................... 307/116; 307/126; 307/127
[58] Field of Search ............... 307/112, 116, 125, 126, 307/127; 340/514, 561, 644

[56] References Cited

U.S. PATENT DOCUMENTS

| 4,672,230 | 6/1987 | Spähn ...................... 307/116 |
| 4,672,233 | 6/1987 | Scott ....................... 307/141 |
| 4,820,935 | 4/1989 | Gontowski ................ 307/112 |
| 4,958,251 | 9/1990 | Cini et al. ................. 361/84 |

FOREIGN PATENT DOCUMENTS 3123828 2/1982 Fed. Rep. of Germany .
3214836 2/1987 Fed. Rep. of Germany .

OTHER PUBLICATIONS

Siemens; Integrierte Schaltungen für Industrielle Anwedungen, datenbuch 1982/83.

Primary Examiner—Jeffrey A. Gaffin
Attorney, Agent, or Firm—Sixbey, Friedman, Leedom & Ferguson

[57] ABSTRACT

An electronic detection circuit such as a proximity switch or flow detector uses a presence detector with complementary outputs and one or more electronic switches to provide either normally-open or normally-closed operation based on the polarity of the supply connections to the device. In one embodiment, two electronic switches are provided, each operating in response to one of the complementary outputs, with each switch connected to provide current flow in a mutually opposite direction between the supply connections upon activation. In another embodiment, a single electronic switch is provided, and is connected through a diode matrix to the complementary outputs.

18 Claims, 5 Drawing Sheets

ELECTRONIC SWITCH APPARATUS

BACKGROUND OF THE INVENTION

The present invention relates to an electronic switching device for use with inductive, capacitive or optoelectronic proximity switches or flow indicators. Such proximity switches or flow indicators normally incorporate an externally-influenced presence detector (comprising an oscillator with an associated switching amplifier downstream from the oscillator), an electronic switch such as a transistor, thyristor, or triac controllable from the presence detector by the switching amplifier, and a full-wave bridge rectifier for providing smooth power input to the presence detector circuit. The electronic switch of the present invention can be a two-terminal switching device (one which both receives power and transmits its detection indication over a single pair of wires). In other embodiments, the circuit of the present invention may be a three-wire switching device with two supply connections and with one additional signal output.

The electronic switches selected for use in these circuits are typically solid-state devices rather than mechanical, contact-type switching devices. Solid-state devices are especially preferred in electrical and electronic measuring, and open- and closed-loop control circuits. Solid-state devices are especially preferred for use in proximity switches. Proximity switches change state when an influencing element, to which the corresponding proximity switch is sensitive, approaches the proximity switch. When the influencing element to which the corresponding proximity switch is sensitive closely approaches the proximity switch, the presence detector circuit in the proximity switch reverses the electronic switch. In the case of a normally-open switch, the previously nonconductive electronic switch then becomes conductive; conversely, normally-closed switches will become non-conductive in response to the approach of the influencing element. With switching devices of the type being discussed it is also possible to indicate whether physical magnitude of an influencing medium, to which the switching device is sensitive, exceeds or falls below the corresponding value. Thus, an essential component of electronic switching devices of the above-described type is the externally-influenced presence detector.

The presence detector may incorporate an inductively or capacitively influenceable oscillator, so as to form an inductive or capacitive proximity switch, respectively. A photoresistor, photodiode or phototransistor can also be used as the presence detector to produce an optoelectronic proximity switch. Finally, to construct a flow indicator, a temperature measuring circuit is used as the presence detector.

In these proximity switches, $K \times V = i$ where $K =$ feedback factor and $V =$ amplification factor of the oscillator. In an inductive proximity switch, when a metal part has not yet approached to a predetermined distance, the oscillator oscillates. Once the corresponding metal part reaches the predetermined distance, the increasing attenuation of the oscillator leads to a reduction of the amplification factor $V$, and the amplitude of the oscillator swing lessens or the oscillator ceases to oscillate. In capacitive proximity switches, while the capacitance induced by a response body between a response electrode and a counterelectrode is low, $K \times V$ is less than 1, and the oscillator does not oscillate. If the response body reaches the predetermined distance, the increasing capacitance generated between the response electrode and the counterelectrode leads to an increase of feedback factor K, so that $K \times V$ 1, i.e., the oscillator begins to oscillate. In the inductive proximity switch and capacitive proximity switch, the electronic switch, such as a transistor, a thyristor or triac is controlled as a function of the different states of the oscillator.

Optoelectronic proximity switches have a optotransmitter and an optoreceiver and are identified as light barriers. In one type of optoelectronic switch, the optotransmitter and optoreceiver are placed on opposite sides of a monitored sector, and in another type the optotransmitter and optoreceiver are placed at the same end of a monitored sector, while a reflector placed at the other end of the monitored sector reflects the light beam from the optotransmitter to the optoreceiver. In both cases, the presence detector responds if the light beam normally reaching the optoreceiver from the optotransmitter is interrupted by an influencing element that has come into the monitored sector. There are also devices of the second type in which the light beam coming from the optotransmitter is reflected to the optoreceiver by the influencing element rather than by a fixed reflector.

Electronic switching devices of the type being discussed—like electric, mechanically operated switching devices—are needed in two types: normally open and normally closed. To minimize inventory requirements, it is not desirable to provide different devices to serve these two circuit functions. Thus, many electronic switching devices of the type being discussed can be used both as normally open and as normally closed devices. In particular, there are electronic switching devices which are "connection programmable," as disclosed in German Offenlegungschrifts 31 23 828 and 32 14 836. "Connection programmable" means that the normally-closed or normally-open characteristic of the device is determined automatically by its connection to the supply voltage.

Different types of "connection programmable" electronic switching devices are known. In one type, instead of the minimum two supply connections, three or four supply connections are provided. Depending on whether the supply voltage is connected to the first and the third supply connection (as illustrated in FIGS. 1 and 3 of DE-OS 31 23 828, and FIG. 2 of DE-OS 32 14 836), or to the first and second supply connection or to the third and the fourth supply connection (as illustrated in FIG. 4 of DE-OS 31 23 828), the switching device works as a normally open or normally closed device. Another type of device, sold in European markets under the designation "Quadronorm," has only two supply connections present. Depending on whether the positive supply voltage is applied to the first and the negative supply voltage is applied to the second supply connection or the negative supply voltage is applied to the first supply connection and the positive supply voltage is applied to the second supply connection, the "Quadronorm" switching device operates as a normally-open or normally-closed switching device.

In the "connection programmable" switching devices described above in detail—as part of the switching amplifier or between the switching amplifier and the electronic switch—an exclusive OR gate is generally needed to implement the desired operation. Commercial integrated circuits (IC's) which implement circuits of this type generally do not include an exclusive OR gate, and it must be provided in a separate circuit.

There are many integrated circuits developed especially for electronic switching devices of the type being discussed here, in which the switching amplifier has two complementary control outputs. For example, model numbers TCA 205 and TCA 305 made by Siemens and model number TDE 0160 made by Thomson-CSF have these characteristics.

SUMMARY OF THE INVENTION

A general object of the invention is to provide a "connection programmable" electronic switching device which can operate in a plurality of modes depending on the connection of external power to the device.

Another broad object of the invention is to provide a detection device incorporating two electronic switches, one of which is actuated to carry current in one of two opposite directions depending on the operating mode of the device.

A further object of the invention is to provide a detection device which operates in response to a different one of two complementary outputs of a detection sub-circuit, depending on the operating mode of the device, which is determined by the polarity of power connections to the device.

A first embodiment of a switching device according to the invention, in which above derived and shown object is achieved, is characterized in that two electronic switches are connected in the circuit, and the two electronic switches can be controlled complementarily by the two complementary control outputs—the make contact control output and break contact control output—of the switching amplifier, such that in the two electronic switches the current can flow only in one direction each, namely in different directions in the two switches. The electronic switch can be a transistor, thyristor, triac, or similar device.

Preferably transistors are used as electronic switches in the above-described electronic switching devices according to the invention. Care must be taken to prevent current flows or current breakdowns between the transistor connections, between which normally no current flows. For this purpose, in each case a protective diode, connected in the forward direction, can be provided between the emitter or the collector of a transistor and the related supply connection.

In a second embodiment of a switching device according to the invention, the electronic switch can be conductively controlled by a first control output—the normally open control output—of the switching amplifier, if and only if the supply voltage is connected in a first, "make contact polarity" to the supply connections. The electronic switch can be conductively controlled by the second control output—break contact control output—of the switching amplifier, if and only if the supply voltage is connected to the supply connections in a second, opposite "break contact polarity."

In the above-described electronic switching device according to the invention, a control signal on the normally open control output of the switching amplifier is "effective," only if the switching device according to the invention is connected as a normally-open device to the supply voltage (that is, if the supply voltage is connected in "make contact polarity" to the supply connections). Correspondingly, in this electronic switching device according to the invention a control signal on the normally closed control output of the switching amplifier is "effective" only if the switching device according to the invention is connected as a normally closed device (i.e. if the supply voltage is connected in "break contact polarity" to the supply connections).

Thus, the present invention recognizes that the complementary control outputs—the normally open contact output and normally closed contact output—of the switching amplifier often present in integrated circuits for electronic switching devices of the type being discussed here can be used in a surprisingly simple way to achieve a "connection programmable" switching device, without any exclusive OR gate being required.

These and further objects, features and advantages of the present invention will become apparent from the following description when taken in connection with the accompanying drawings which show, for purposes of illustration only, several embodiments in accordance with the present invention.

DETAILED DESCRIPTION OF THE PREFERRED EMBODIMENTS

In the various Figures, the circuit details of the electronic switching devices according to the invention are described in the context of an inductive proximity switch. It should be understood that the teachings of the invention are not so limited, but may be applied to any type of proximity switch or flow indicator.

Figure 1:
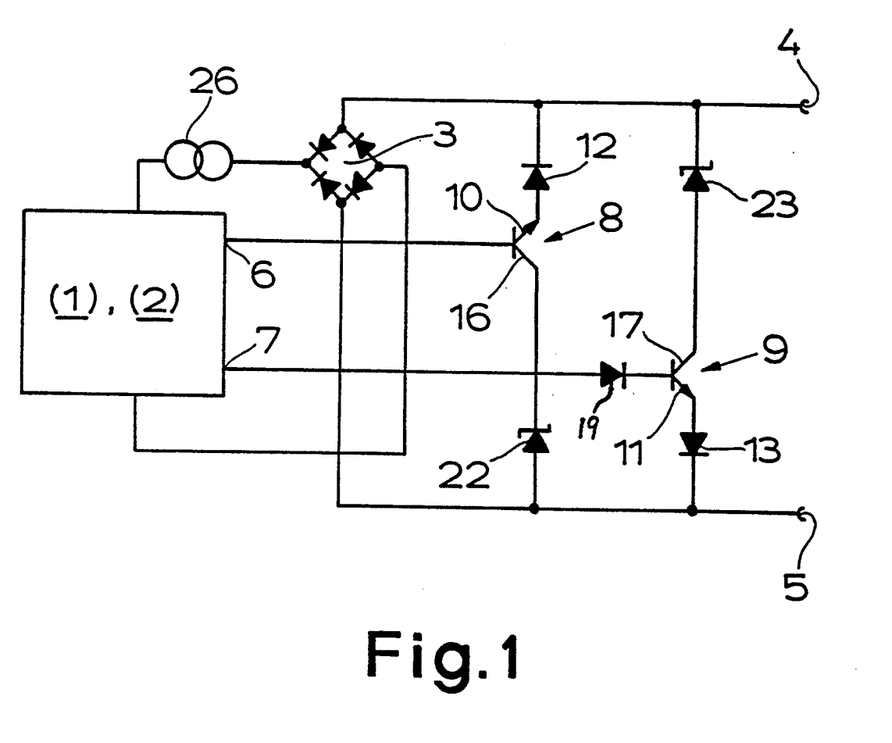
FIG. 1 is a schematic diagram of a first embodiment of an electronic switching device according to the present invention.
Figure 2:
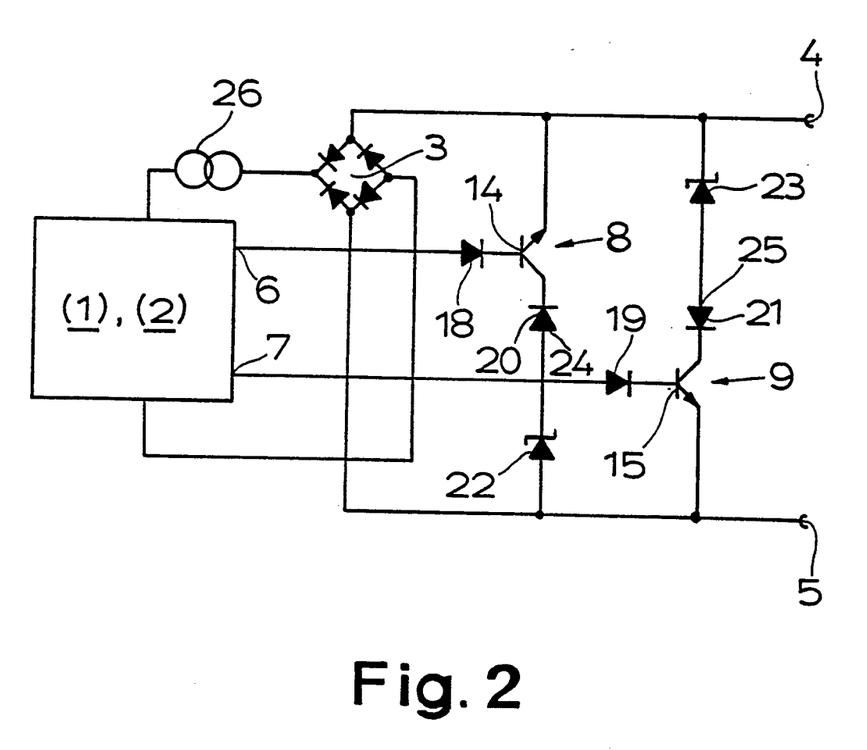
FIG. 2 is a schematic diagram of a second embodiment of an electronic switching device according to the present invention.
Figure 3:
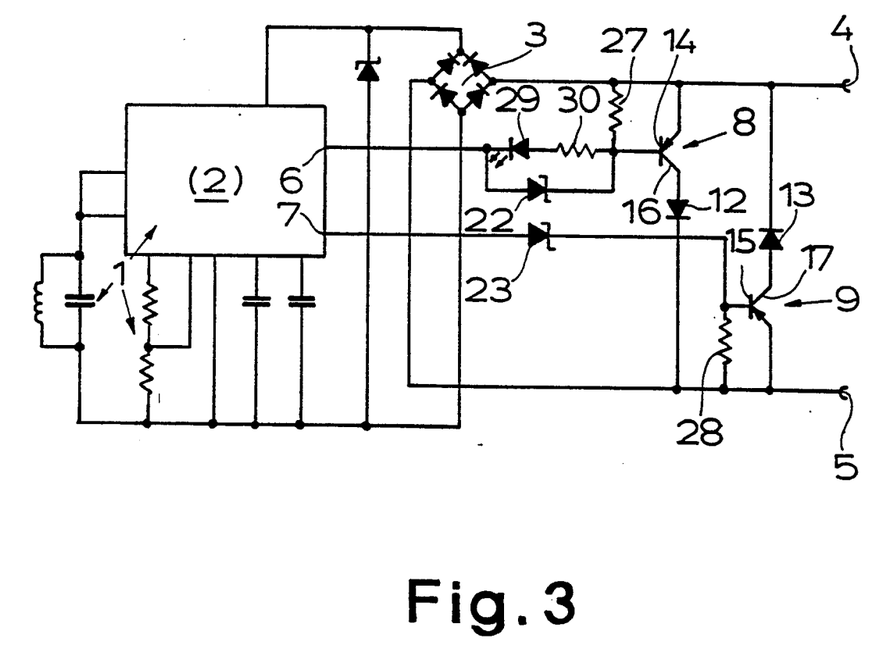
FIG. 3 is a schematic diagram of a third embodiment of an electronic switching device according to the present invention.

The electronic sensing devices of FIGS. 1 to 3 each include an oscillator 1, a switching amplifier 2 downstream from the presence detector or oscillator 1, and a full-wave bridge rectifier 3 connected to two supply connections 4 and 5. In each case, switching amplifier 2 has two complementary control outputs, namely a make-contact control output 6 and a break-contact control output 7.

As shown in FIGS. 1 to 3, full-wave bridge rectifier 3 is connected to draw power from supply connections 4 and 5 and, to provide a rectified output to the presence detector comprising oscillator 1 and switching amplifier 2. In the embodiments of FIGS. 1 and 2, the output of full-wave bridge rectifier 3 is connected to oscillator 1 and switching amplifier 2 through a current and/or voltage regulator 26.

In the embodiments of FIGS. 1 to 3, first and second electronic switches are provided in the form of transistors 8 and 9. The circuits of FIGS. 1 to 3 are two-wire circuits. The term "two-wire circuit" refers to the fact that terminals 4 and 5 serve a dual function, acting as both a power source for the circuit and as an output for the circuit. Specifically, supply connections 4 and 5 provide necessary power for electronic devices in the circuit such as oscillator 1 and switching amplifier 2. At the same time, supply connections 4 and 5 act as the outputs of the circuit; in the conductive state of one of the two electronic switches, i.e., of transistor 8 or transistor 9, a load current of an electricity consuming device, not shown, flows through supply connections 4 and 5. Consequently, in the conductive state of transistor 8 or transistor 9, necessary supply voltage and supply current is available for operation of the presence detector, i.e., for oscillator 1 and for switching amplifier 2.

As noted previously, in the embodiments of FIGS. 1 to 3 two electronic switches are provided, and controlled complementarily by the two complementary control outputs—make contact control output 6 and break contact control output 7—of switching amplifier 2. In the two electronic switches, transistors 8 and 9, the current can flow only in one direction within each switch, and current in the first switch (transistor 8) flows in the opposite direction of current in the second switch (transistor 9). The two electronic switches with their different current forward directions are connected in parallel between supply connections 4 and 5.

The specific operation of each of the circuits in FIGS. 1, 2, and 3 differs. In the embodiment of FIG. 1, transistor 8 is an NPN transistor with an emitter 10 and a collector 16 and is connected through its base to control output 6. Transistor 9 is also an NPN transistor, and has an emitter 11 and collector 17. Control output 6 is connected through protective diode 19 to the base of transistor 9. Protective diodes 12 and 13 are connected in the forward direction between emitters 10 and 11 respectively, and the corresponding supply connections 4 and 5 respectively. Zener diodes 22 and 23, in combination with the diode voltage drops of transistors 8 and 9 respectively, fix the supply voltage or the supply current for the presence detector, i.e., for oscillator 1 and switching amplifier 2. As shown, Zener diodes 22 and 23 are connected respectively between supply connections 5 and 4, and collectors 16 and 17 of transistors 8 and 9.

In the embodiment of FIG. 2, protective diodes 18 and 19 are connected in the forward direction between controls outputs 6 and 7 and the bases of transistors 8 and 9, respectively. Protective diodes 20 and 21 are connected in the forward direction between Zener diodes 22 and 23 and collectors 16 and 17 respectively. Zener diodes 22, 23 are connected respectively between supply connections 5 and 4 and the anodes 24 and 25 of protective diodes 20 and 21, respectively.

In the embodiment of FIG. 3, the emitter of transistor 9 is connected to supply connection 5, and the collector 17 of transistor 9 is connected to the anode of protective diode 13, and the cathode of protective diode 13 is connected to supply connection 4. The emitter of transistor 8 is connected to supply connection 4, and the collector 16 of transistor 8 is connected to the anode of protective diode 12. The cathode of protective diode 12 is connected to supply connection 5. Zener diodes 22, 23 are connected between bases 14 and 15 of transistors 8 and 9 respectively and the corresponding control output of the switching amplifier, i.e. make contact control output 6 and break contact control output 7. Pull-up resistors 27 and 28 are provided between supply connection 4 and base 14 of transistor 8 as well as between supply connection 5 and base 15 of transistor 9. A light-emitting diode 29 having a protective resistor 30 connected in series therewith is connected between base 14 of transistor 8 and control output 6 of switching amplifier 2 to provide an output indication reflecting the sensing state of the circuit.

Care must be taken that in the two electronic switches the current can flow only in one direction each, namely in different directions in the two switches. When triacs are used, additional current direction diodes must be provided to ensure that the current can flow only in one direction through each triac. The two electronic switches with different current forward directions are connected to the two supply connections parallel to one another.

Figure 4:
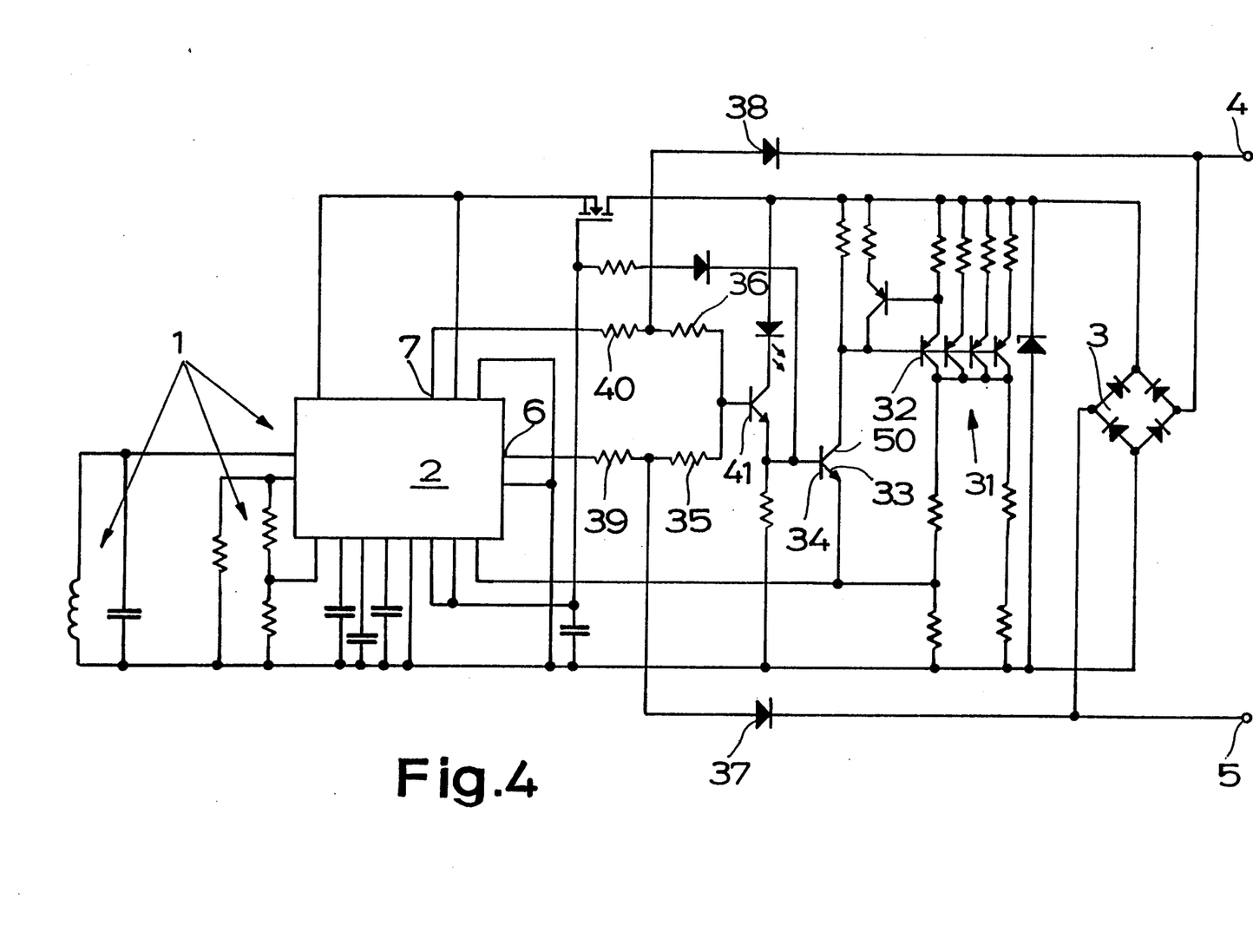
FIG. 4 is a schematic diagram of a fourth embodiment of an electronic switching device according to the present invention.
Figure 5:
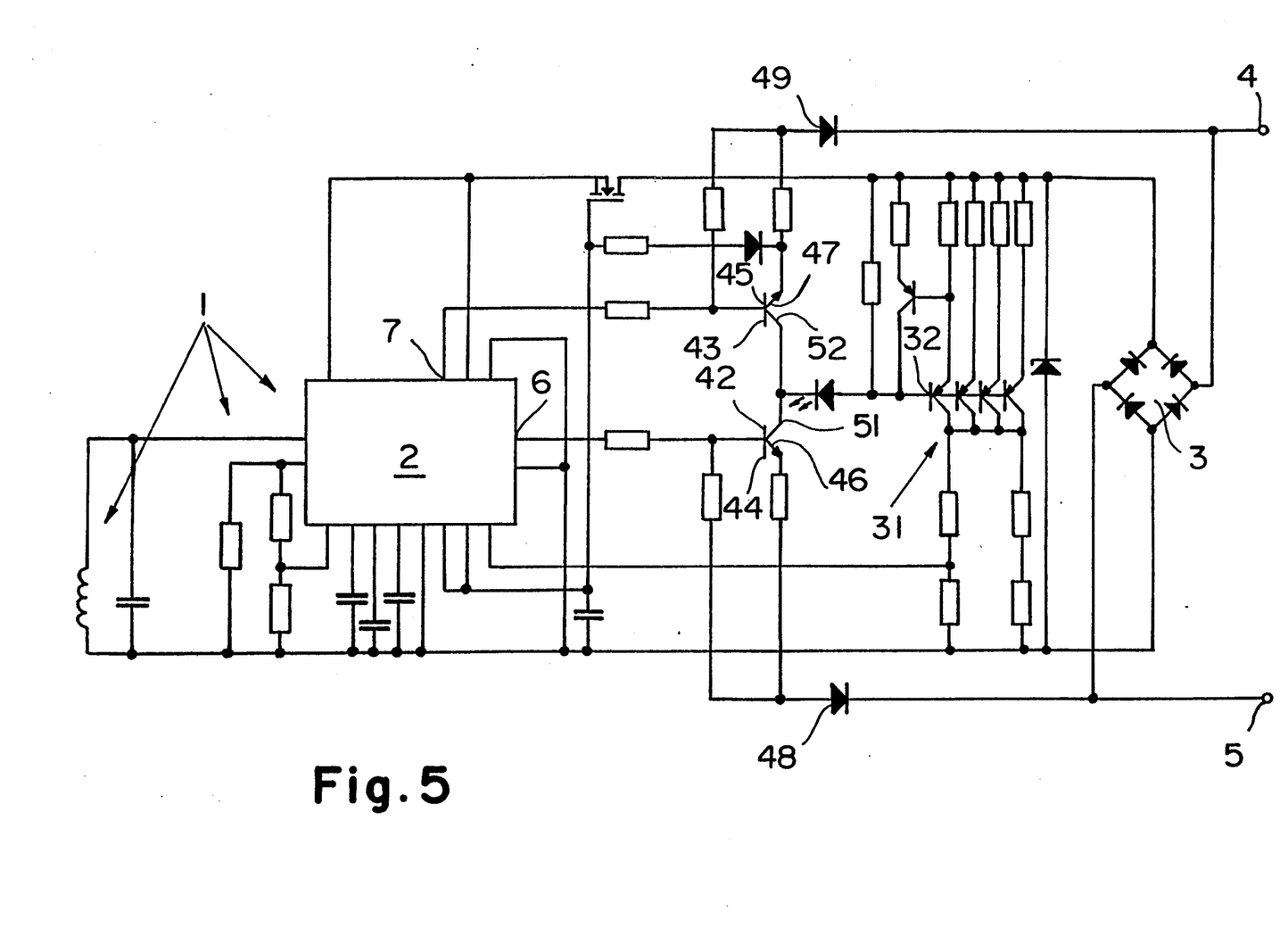
FIG. 5 is a schematic diagram of a fifth embodiment of an electronic switching device according to the present invention.

Referring now to FIGS. 4 and 5, the electronic switching devices represented are two-wire circuits like the circuits of FIGS. 1 to 3. In the embodiments of FIGS. 4 and 5, a single electronic switch 31 is provided rather than two electronic switches. Electronic switch 31 is conductively controllable by make-contact control output 6 of switching amplifier 2 only if the supply voltage is connected to supply connections 4 and 5 with a first polarity, and is conductively controllable by breakcontact control output 7 of switching amplifier 2 only if the supply voltage is connected to supply connections 4 and 5 with a second polarity opposite to the first polarity. A control signal on make-contact control output 6 of switching amplifier 2 is effective only if the switching device is connected to the supply voltage in normally open configuration or if the supply voltage is connected in the proper "make contact polarity" to supply connections 4 and 5. Correspondingly, a control signal on break-contact control output 7 of switching amplifier 2 is effective only if the switching device according to the invention is connected to the supply voltage in normally closed configuration or if the supply voltage is connected in an opposite, "break contact polarity" to supply connections 4 and 5.

Referring now to FIG. 4, a control transistor 33 is provided between make contact control output 6 of switching amplifier 2, and control input 32 of electronic switch 31. Base 34 of control transistor 33 can be controlled by make contact control output 6 of switching amplifier 2 if and only if the supply voltage is connected to supply connections 4 and 5 in "make contact polarity," and can be controlled by break contact control output 7 of switching amplifier 2 if and only if the supply voltage is connected to supply connections 4 and 5 in an opposite "break contact polarity." Electronic switch 31 conducts when actuated by control transistor 33. Control resistor 35 is connected between make contact control output 6 of switching amplifier 2 and base 34 of control transistor 33, and control resistor 36 is connected between break contact control output 7 of switching amplifier 2 and base 34 of control transistor 33. Connection matrix diodes 37 and 38, connected in the forward direction, are provided between the ends of control resistors 35, 36 away from base 34 of control transistor 33, and the supply connections 4 and 5 respectively. Decoupling resistor 39 is connected between make contact control output 6 of switching amplifier 2 and related control resistor 36, and decoupling resistor 40 is connected between break contact control output 7 of switching amplifier 2 and related control resistor 36. An auxiliary control transistor 41 is connected upstream from control transistor 33 on the input side. Control input 32 of electronic switch 31 is connected to collector 50 of control transistor 33.

In the switching device of FIG. 4, when the negative pole of the supply voltage is connected to supply connection 4 and the positive pole of the supply voltage is connected to supply connection 5, this switching device operates as a normally open device; this connection of the supply voltage is thus a connection in "make contact polarity." The presence of a control signal on make contact control output 6 of switching amplifier 2 causes auxiliary control transistor 41 and control transistor 33 to become conductive and consequently, electronic switch 31, consisting of four transistors, also becomes conductive. Any control signals on break contact control output 7 of switching amplifier 2 do not cause conduction of the transistors because of the blocking action of connection matrix diode 38.

If the positive pole of the supply voltage is connected to supply connection 4 and the negative pole of the supply voltage is connected to supply connection 5, the circuit of FIG. 4 then operates as a normally closed device; this connection of the supply voltage will be referred to as a connection in "break contact polarity." A control signal on break contact control output 7 of switching amplifier causes auxiliary control transistor 41 and control transistor 33 to conduct, and consequently also causes electronic switch 31 to conduct. Any control signal on make contact control output 6 of switching amplifier 2 has no effect on the transistors because of the blocking action of connection matrix diode 37.

Referring now to FIG. 5, a make contact control transistor 42 with a base 44 is connected between make contact control output 6 of switching amplifier 2 and control input 32 of electronic switch 31. Break contact control transistor 43 having base 45 is connected between break contact control output 7 of switching amplifier 2 and control input 32 of electronic switch 31. Base 44 of make contact control transistor 42 is controllable by make contact control output 6 of switching amplifier 2 if and only if the supply voltage is connected to supply connections 4 and 5 in "make contact polarity." Base 45 of break contact control transistor 43 is controllable by break contact control output 7 of switching amplifier 2 if and only if the supply voltage is connected in an opposite "break contact polarity" to the supply connections 4 and 5. The conduction of electronic switch 31 is controllable by actuated make contact control transistor 43. Connection matrix diode 48 is connected in the forward direction between either base 44 or emitter 46 of make contact control transistor 42 and supply connection 5. Connection matrix diode 49 is connected in the forward direction between either base 45 or emitter 47 of break contact control transistor 43 and supply connection 4. Control input 32 of electronic switch 31 is connected to collectors 51 and 52 of make contact control transistor 42 and break contact control transistor 43, respectively.

The electronic switching device shown in FIG. 5 operates in the following manner: If the positive pole of the supply voltage is connected to supply connection 4 and the negative pole of the supply voltage is connected to supply connection 5, this switching device then operates as a normally open device; this connection of the supply voltage is thus a connection having "make contact polarity." A subsequent control signal on make contact control output 6 of switching amplifier 2 causes make contact control transistor 42 to conduct and consequently also causes electronic switch 31, consisting again of four transistors, to conduct. Any control signal on break contact control output 7 of switching amplifier 2 will not affect the operation of the transistors because of the blocking action of connection matrix diode 49.

Similarly, if the negative pole of the supply voltage is connected to supply connection 4 and the positive pole of the supply voltage is connected to supply connection 5, the switching device of FIG. 5 operates as a normally closed device; this connection of the supply voltage is thus a connection in "break contact polarity." A control signal on break contact control output 7 of switching amplifier 2 causes break contact control transistor 43 to conduct and consequently also causes electronic switch 31 to conduct. Any control signal on make contact control output 6 of switching amplifier 2 will have no effect on the state of the transistors because of the blocking action of connection matrix diode 48.

While various embodiments have been shown and described in accordance with the present invention, it is understood that the same is not limited thereto, but is susceptible of numerous changes and modifications as known to those skilled in the art; therefore, the invention is not limited to the details shown and described herein, but covers all such changes and modifications as are encompassed by the scope of the appended claims.

I claim:

1. An electronic detection circuit, comprising:
   first and second supply connections for receiving a supply voltage in one of a first polarity and a second polarity opposite to the first polarity;
   a presence detection circuit connected to receiver power from the supply connections, for detecting matter in proximity to itself;
   a switching means downstream from the presence detector and connected thereto, said switching means providing first and second mutually complementary control outputs based on the detection state of the presence detection circuit;
   a first electronic switch connected to the first control output of the switching means and controllable from the presence detector thereby only when the supply voltage is provided in the first polarity, to produce a first current flow output; and
   a second electronic switch connected to the second control output of the switching means and controlled thereby only when the supply voltage is provided in the second polarity, to produce a second current flow output;
   wherein at least one of the first and second current flow outputs defines a status output of the electronic detection circuit indicative of the proximity of matter to the presence detection circuit, with said status output providing a first output mode when the supply voltage is connected in the first polarity and a second output mode when the supply voltage is connected in the second polarity; and
   wherein the first electronic switch is connected to produce said first current flow output from the first supply connection to the second supply connection, and the second electronic switch is connected to produce said second current flow output from the second supply connection to the first supply connection, so that in the first output mode the circuit operates as a normally open device and in the second output mode the circuit operates as a normally closed device.

2. The electronic detection circuit of claim 1, wherein the first and second electronic switches are first and second transistors, each having a protective diode connected in the forward direction between one of its emitter and its collector and the first and second supply connections, respectively.

3. The electronic detection circuit of claim 2, wherein protective diodes are connected in the forward direction between the first and second control outputs and the bases of the first and second transistors and also between the collectors of the first and second transistors and the first and second supply connections, respectively.

4. The electronic detection circuit of claim 2 further including a Zener diode connected to each of the first and second transistors to establish a minimum supply voltage for the presence detection circuit.

5. The electronic detection circuit of claim 4 wherein the Zener diodes are connected in series between the collector of the first transistor and the first supply connection, and the collector of the second transistor and the second supply connection, respectively.

6. The electronic detection circuit of claim 4, wherein said Zener diodes are connected between the base of each of the first and second transistors and the first and second control outputs of the switching amplifier, respectively.

7. The electronic detection circuit of claim 4, wherein a full-wave bridge rectifier is connected to receive power from the first and second supply connections and to provide rectified voltage to the presence detection circuit.

8. The electronic detection circuit of claim 1, wherein a full-wave bridge rectifier is connected to receive power from the first and second supply connections and to provide rectified voltage to the presence detection circuit.

9. An electronic detection circuit, comprising:
first and second supply connections for receiving a supply voltage in one of a first polarity and a second polarity opposite to the first polarity;
a presence detection circuit connected to receive power from the supply connections, for detecting matter in proximity to itself;
a switching means connected to the presence detection circuit for providing first and second mutually complementary control outputs according to the detection state of the presence detection circuit; and
an electronic switch for providing a circuit output, connected by a control input to the first and second control outputs of the switching means such that the conductivity of the electronic switch is controlled by the first control output if and only if the supply voltage is connected in the first polarity to the supply connections, and such that the conductivity of the electronic switch is controlled by the second control output if and only if the supply voltage is connected in the second polarity to the supply connections, thereby generating the circuit output in one of first and second modes, depending on the polarity of the supply voltage; wherein the first mode provides a normally-open type output and the second mode provides a normally-closed type output.

10. The electronic detection circuit of claim 9, wherein a make-contact control transistor is connected between the first control output and the control input of the electronic switch, and a break-contact control transistor is connected between the second control output and the control input of the electronic switch, such that the conductivity of the make-contact control transistor is controllable by the first control output if and only if the supply voltage is connected in the first polarity, and such that the conductivity of the break-contact control transistor is controllable by the second control output if and only if the supply voltage is connected in the second polarity, and wherein the conductivity of the electronic switch controlled based on the conductivity of one of the make-contact control transistor and the break-contact control transistor.

11. The electronic detection circuit of claim 10, wherein first and second connection matrix diodes are connected in the forward direction, respectively, between one of the base and emitter of the make-contact control transistor and the first supply connection, and between one of the base and emitter of the break-contact control transistor and the second supply connection.

12. The electronic detection circuit of claim 10, wherein the control input of the electronic switch is connected to the collectors of the make-contact control transistor and the break-contact control transistor, respectively.

13. An electronic detection circuit, comprising:
first and second supply connections for receiving a supply voltage in one of a first polarity and a second polarity opposite to the first polarity;
a presence-detection circuit connected to receive power from the supply connections, for detecting matter in proximity to itself;
a switching means connected to the presence detection circuit for providing first and second mutually complementary control outputs according to the detection state of the presence detection circuit;
an electronic switch for providing a circuit output, connected by a control input to the first and second control outputs of the switching means such that the conductivity of the electronic switch is controlled by the first control output if and only if the supply voltage is connected in the first polarity to the supply connections, and such that the conductivity of the electronic switch is controlled by the second control output if and only if the supply voltage is connected in the second polarity to the supply connections, thereby generating the circuit output in one of first and second modes, depending on the polarity of the supply voltage; and
a control transistor means connected between the first and second control outputs of the switching amplifier and the control input of the electronic switch, for actuating the electronic switch in response to signals form the first and second control outputs.

14. The electronic detection circuit of claim 13, wherein the control transistor means is a switching transistor having a base, emitter, and collector, and further including a first control resistor connected in series between the first control output and the base of the switching transistor and a second control resistor connected in series between the second control input and the base of the switching transistor; and further including first and second connection matrix diodes connected in the forward direction betwen the first and second control resistors and the first and second supply connections, respectively.

15. The electronic detection circuit of claim 14, further including first and second decoupling resistors connected respectively between the first control output and the first control resistor, and between the second control output and the second control resistor.

16. The electronic detection circuit of claim 15, wherein the control input of the electronic switch is connected to the collector of the switching transistor.

17. The electronic detection circuit of claim 14, wherein a further auxiliary control transistor is connected upstream from the switching transistor on the input side.

18. The electronic detection circuit of claim 14, wherein the control input of the electronic switch is connected to the collector of the switching transistor.

* * * * *